United States Patent
Smith et al.

(10) Patent No.: US 10,615,764 B1
(45) Date of Patent: Apr. 7, 2020

(54) TUNABLE PINK NOISE GENERATOR WITH NO LOW FREQUENCY CUTOFF

(71) Applicant: HRL Laboratories, LLC, Malibu, CA (US)

(72) Inventors: Aaron C. Smith, Westlake Village, CA (US); Daniel S. Matic, Newbury Park, CA (US); Seth Merkel, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/560,933

(22) Filed: Sep. 4, 2019

Related U.S. Application Data

(60) Provisional application No. 62/729,342, filed on Sep. 10, 2018, provisional application No. 62/737,363, filed on Sep. 27, 2018, provisional application No. 62/752,204, filed on Oct. 29, 2018.

(51) Int. Cl.
*H04B 1/06* (2006.01)
*H03G 5/14* (2006.01)
*G06F 7/58* (2006.01)

(52) U.S. Cl.
CPC .............. *H03G 5/14* (2013.01); *G06F 7/582* (2013.01)

(58) Field of Classification Search
CPC ....... H04L 5/14; H04L 1/0048; H04L 1/0051; G06F 7/582; G06F 7/588; G06N 7/005; H03K 7/08; H04B 1/1081; H04B 7/0413
See application file for complete search history.

(56) References Cited

U.S. PATENT DOCUMENTS

| | | | |
|---|---|---|---|
| 7,449,967 B2 * | 11/2008 | Ueda | H03K 3/84 331/78 |
| 8,161,329 B2 * | 4/2012 | Ramakrishnan | G06F 11/3684 341/109 |
| 9,100,153 B2 * | 8/2015 | Gross | H04L 1/005 |
| 2018/0204131 A1 * | 7/2018 | Najafi | G06N 7/005 |
| 2019/0121839 A1 * | 4/2019 | Mohajer | G06N 7/00 |
| 2019/0253090 A1 * | 8/2019 | Hedstrom | H04B 1/1081 |

* cited by examiner

*Primary Examiner* — Nhan T Le
(74) *Attorney, Agent, or Firm* — Ladas & Parry

(57) ABSTRACT

A method for providing pink noise and improving computational efficiency including providing $N_S$ stochastic signal generators, generating a respective first random number g with variance $\sigma$ and generating a respective second random number u for each respective stochastic signal generator at each discrete time n, comparing the respective second random number u with an update probability for the respective stochastic signal generator at each discrete time n, if the respective u is greater than the update probability, then not changing a respective output of the respective stochastic signal generator, if the respective u is less than or equal to the update probability, then updating the respective output of the respective stochastic signal generator to be equal to the first random number, and summing at each discrete time n the respective output of each of the $N_S$ stochastic signal generators.

23 Claims, 4 Drawing Sheets

TUNABLE PINK NOISE GENERATOR WITH NO LOW FREQUENCY CUTOFF

CROSS REFERENCE TO RELATED APPLICATIONS

This application is related to and claims the benefit of U.S. Provisional Patent Application No. 62/729,342 filed on Sep. 10, 2018, U.S. Provisional Patent Application No. 62/737,363 filed on Sep. 27, 2018, and U.S. Provisional Patent Application No. 62/752,204 filed on Oct. 29, 2018 which are incorporated herein by reference as though set forth in full.

STATEMENT REGARDING FEDERAL FUNDING

This invention was made with U.S. Government support. The U.S. Government has certain rights in this invention.

TECHNICAL FIELD

This disclosure relates to noise generation circuits.

BACKGROUND

Prior art pink (1/f) noise generation circuits are primarily used in audio engineering applications, and are inferior for several reasons. Some prior art noise generation circuits use noisy components, such as diodes, that lack the desired precision and tune-ability of the presently disclosed invention. Also, noise traces cannot be regenerated with these prior art noise generation circuits as the noise is not created using a deterministic pseudo-random process.

In the prior art, pink spectral shaping has been accomplished with standard 10 dB/decade low-pass filters which require impractically large components for ultra-low frequency operation in the sub audio frequency range.

Prior art noise signals are also intrinsically analog and thus cannot be used in an all-digital system.

A prior art pink noise generation algorithm in the context of audio engineering software development has been described by James McCartney and Larry Trammell in the web page http://www.firstpr.com.au/dsp/pink-noise/, which is incorporated herein by reference; however, the method is computationally complex and no circuit implementation is described.

What is needed is an all-digital noise generation circuit that produces pink (1/f) noise. Further, it is desirable that the generated pink noise has a tunable amplitude, has no low frequency cutoff, and be able to be regenerated. The embodiments of the present disclosure answer these and other needs.

SUMMARY

In a first embodiment disclosed herein, a method for providing pink noise and for improving computational efficiency for providing pink noise comprises providing $N_S$ stochastic signal generators, wherein each of the $N_S$ stochastic signal generators has a respective output at each discrete time n, generating a respective first random number g with variance $\sigma$ for each respective stochastic signal generator at each discrete time n, generating a respective second random number u for each respective stochastic signal generator at each discrete time n, comparing for each respective stochastic signal generator the respective second random number u with an update probability for the respective stochastic signal generator at each discrete time n, wherein the update probability for an Nth respective stochastic signal generator is $\frac{1}{2}^N$, where N ranges from 1 to $N_S$ for the respective stochastic signal generators, if the respective second random number u is greater than the update probability for the respective stochastic signal generator, then not updating a respective output of the respective stochastic signal generator, if the respective second random number u is less than or equal to the update probability for the respective stochastic signal generator, then updating the respective output of the respective stochastic signal generator to be equal to the first random number, and summing at each discrete time n the respective output of each of the $N_S$ stochastic signal generators to provide a sum.

In another embodiment disclosed herein, a device for generating pink noise and for improving computational efficiency for providing pink noise comprises $N_S$ stochastic signal generators, wherein each respective stochastic signal generator of the $N_S$ stochastic signal generators comprises, a random number generator for a generating a respective first random number g with variance $\sigma$ for the respective stochastic signal generator and for generating a respective second random number u for the respective stochastic signal generator, a comparator coupled to the random number generator for comparing for the respective stochastic signal generator the respective second random number u with an update probability for the respective stochastic signal generator, wherein the update probability for an Nth respective stochastic signal generator is $\frac{1}{2}^N$, where N ranges from 1 to $N_S$ for the respective stochastic signal generators, and a register for storing a respective output of the respective stochastic signal generator, wherein if the respective second random number u is greater than the update probability for the respective stochastic signal generator, then not updating or changing the respective output stored in the register for the respective stochastic signal generator, and wherein if the respective second random number u is less than or equal to the update probability for the respective stochastic signal generator, then storing the first random number in the register, and a summer coupled to an output of each respective stochastic signal generator for summing at each discrete time n the respective output of each of the $N_S$ stochastic signal generators.

In still another embodiment disclosed herein, a device for generating pink noise and for improving computational efficiency for providing pink noise comprises a random number generator for generating a first random number g with variance $\sigma$ output at each discrete time n, and for generating a second uniformly random number u output at each discrete time n, $N_S$ registers, each of the $N_S$ registers for storing a respective one of $N_S$ stochastic values, a priority encoder coupled to the second random number u output for determining at each discrete time n a selected respective stochastic value of the $N_S$ stochastic values to update with the first random number g with variance $\sigma$ output, a sum register, and a summer coupled to the $N_S$ registers, the first random number g with variance $\sigma$ output, and to the sum register, and having an output coupled to the sum register, wherein the summer adds the first random number g with variance $\sigma$ to a sum stored in the sum register and subtracts the selected respective stochastic value to form a new sum at each discrete time n, wherein the new sum is stored in the sum register at each discrete time n, and wherein the first random number g with variance $\sigma$ output is stored in the respective register for the selected respective stochastic value at each discrete time n.

In still another embodiment disclosed herein, a method for generating pink noise and for improving computational efficiency for providing pink noise comprises generating a first random number g with variance σ output at each discrete time n, generating a second uniformly random number u output at each discrete time n, storing $N_S$ stochastic values, using the second random number u output for determining at each discrete time n a selected respective one of the stored $N_S$ stochastic values to update with the first random number g with variance σ output at each discrete time n, storing a sum, adding the first random number g with variance σ output to the sum and subtracting the stochastic value of the selected respective one of the stored $N_S$ stochastic values to form a new sum at each discrete time n, replacing the stored sum with the new sum at each discrete time n, and replacing the stochastic value of the selected respective one of the stored $N_S$ stochastic values with the first random number g with variance σ output at each discrete time n.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 4A shows an example output from the voltage noise generation circuit of FIG. 3, showing a single noise trace.

DETAILED DESCRIPTION

Figure 1:
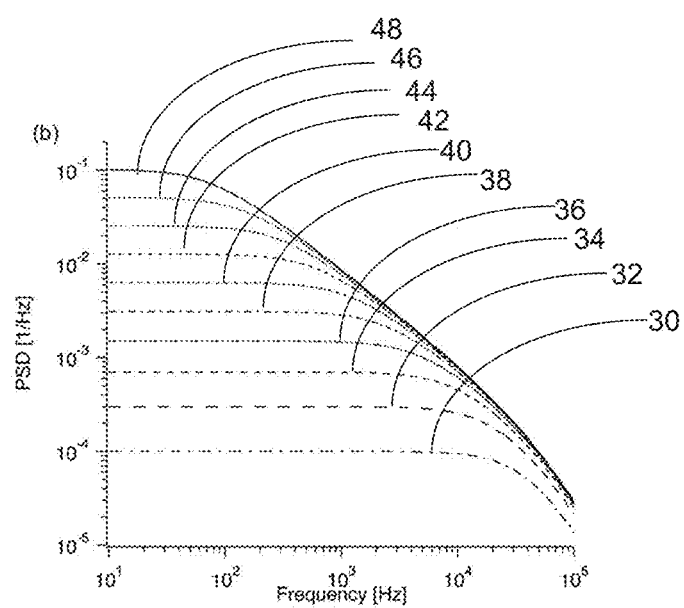
FIG. 1 shows a set of curves for partial sums of stochastic signals, in accordance with the present disclosure.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

One object of the present invention is to generate pink (1/f) noise signals that have a precisely defined amplitude, no low frequency cutoff, and that can be reliably regenerated. Other objects are low cost, efficient implementation in digital hardware, and computational efficiency to improve operation on a computer or processor.

The stochastic signal used herein is a discrete time-series which is a function of two parameters, p and σ, where each sample in the series is chosen to be equal to the previous sample with probability 1−p or is a random number g drawn from a distribution with variance σ:

$$B_n(\sigma, p) = \begin{Bmatrix} g(\sigma) \text{ with probability } & p \\ B_{n-1} \text{ with probability } & 1-p \end{Bmatrix}$$

where $B_n$ is the current stochastic signal in a time series, where $B_{n-1}$ is the previous stochastic signal in the time series, where g is a random number with variance σ, and where p is the probability that $B_n$ will be set to the new value g.

The distribution from which g is drawn may typically be a uniform distribution. A time-series constructed in this way has an average discrete power spectral density which has the same response as a Butterworth filter:

$$PSD_k(\sigma, p) = \frac{4\sigma^2 / f_0}{1 + \left(\frac{f_k}{f_0}\right)^{2O(p)}}$$

Where $f_0 = pF_S$ is the corner frequency, the frequency where attenuation reduces the power by half of the peak power, where $F_S$ is the sampling frequency, and where $f_k$ is the discrete frequency component of the $B_n$ time series.

The filter order O(p) has very weak dependence on probability p and is approximately 1 for p less than or equal to ½.

Pink noise may be generated by adding a set of these stochastic signals where each signal has the same σ but the probability p is decreased by a factor of two in each succeeding cascaded stochastic signal. Each signal in the cascade thus has its corner frequency shifted down an octave but the amplitude shifted up a factor of 2 relative to the signal before it. The sum of a set of cascaded stochastic signals is shown in the equation below.

$$S_n = B_n\left(\sigma, \frac{1}{2}\right) + B_n\left(\sigma, \frac{1}{4}\right) + \ldots + B_n\left(\sigma, \frac{1}{2^{N_S}}\right) = \sum_{i=1}^{N_S} B_n\left(\sigma, \frac{1}{2^i}\right)$$

As the number of cascaded signals $N_S$ included in the sum increases, the power spectral density approximates 1/f very well in the band over the frequency range: $F_S/2^{N_S}, F_S/2$. When using a single signal per octave to cover a bandwidth $\Delta F = F_{High} - F_{Low}$, the number of signals needed is $N_S = \text{Log}_2(F_{High}/F_{Low})$. To achieve very high frequency operation with no low frequency cutoff, $F_{High}$ can be set to $10^{12}$ Hz, which is faster than any available digital logic, and $F_{Low}$ can be set to be $1/T_{AgeOfUniverse}$ which is approximately $10^{-18}$ Hz. With those assumptions, the number of cascaded signals needed is about 100.

Figure 2A:
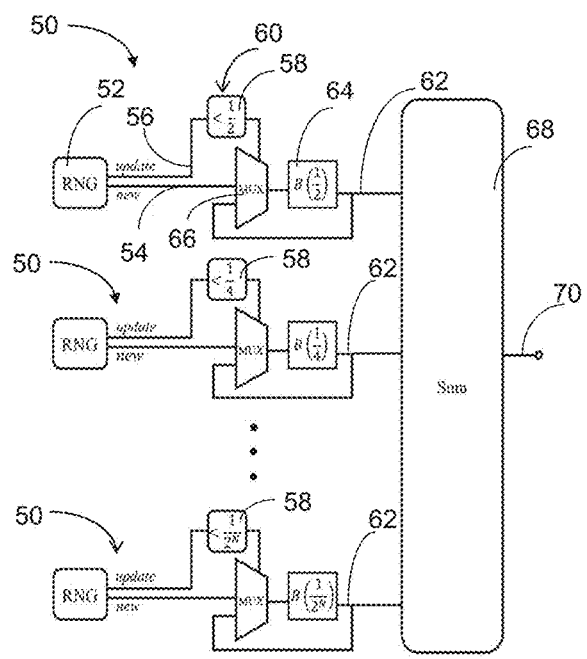
FIG. 2A shows an embodiment of a pink noise generation circuit.

FIG. 1 shows partial sums for varying numbers of stochastic signals. The curve with reference number 30 in FIG. 1 is a stochastic signal with a probability p of ¼. The curve with reference number 32 in FIG. 1 is the sum of two stochastic signals with a probability p of ¼ and ⅛, respectively. The curve with reference number 34 in FIG. 1 is the sum of three stochastic signals, which have a probability p of ¼, ⅛, and 1/16, respectively. And so on for curves with reference numbers 36, 38, 40, 42, 44, and 46. The curve with reference number 48 in FIG. 1B is the sum of stochastic signals, which have a probability p of ¼, ⅛, 1/16, 1/32, 1/64, 1/128, 1/256, 1/512, 1/1024 and 1/2048, respectively. As can be seen in FIG. 1, as more stochastic signals are added, the power spectrum density approaches 1/f. FIG. 2A shows an embodiment of a pink noise generation circuit in accordance with the present disclosure. In FIG. 2A, the circuit for pink noise generation uses $N_S$ independent stochastic signal generators 50. Each stochastic signal generator has a random number generator (RNG) 52 that outputs two numbers: a new g with variance σ 54 and a uniformly random u 56, which is compared against that respective stochastic signal's update probability 58 by a comparator 60. Note that the update probability 58 is different for each of the independent stochastic signal generators 50. If u 56 is greater than the update probability 58 for a respective stochastic signal generator 50, then the previous value $B_{n-1}$ 62 for that respective stochastic signal generator 50 is kept and fed back to register 64 via multiplexer 66, as shown in FIG. 2A. If u 56 is less than the update probability 58, then g with variance σ 54 is selected and fed through the multiplexer 66, and stored into register 64 in the respective stochastic signal generator 50. The generated results for the independently generated stochastic signals 62 are then summed together by summer 68.

In the approach described in FIG. 2A, each individual stochastic signal generator 50 requires a dedicated random number generator 52 to generate two values: uniformly random u 56 to compare to that stochastic generator's update probability 58 and g with variance σ 54 to use if that stochastic signal is to be updated. The comparator 60 performs the comparison to that stochastic signal's update probability 58. The summer 68 sums all $N_S$ input signals 62 at each discrete time regardless of whether or not a given individual signal has been updated.

Figure 2B:
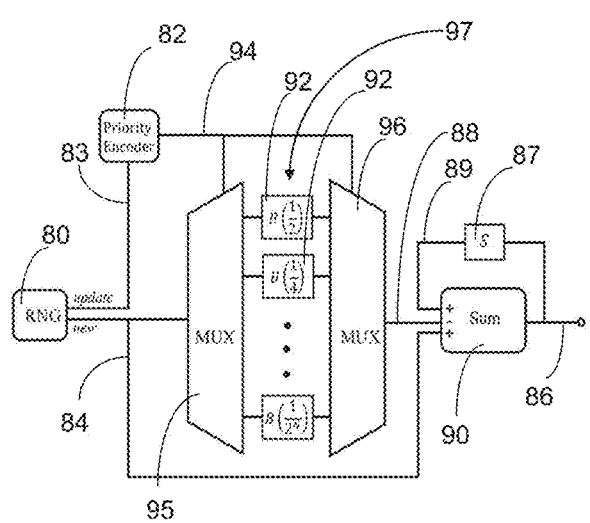
FIG. 2B shows another embodiment of a pink noise generation circuit in accordance with the present disclosure.

FIG. 2B shows another embodiment which requires only a single random number generator (RNG) module 80 and which performs a summation, which is very computationally efficient. The embodiment shown in FIG. 2B improves the computational efficiency for generating pink noise using a computer or processor and simplifies circuitry for a hardware implementation.

In the embodiment shown in FIG. 2B, only one stochastic signal is updated at each time step. We note that the sum of the probabilities of the $N_S$ independent stochastic signal is always less than one, because the sum of the series ½+¼+⅛ . . . is less than one, thus selecting only one stochastic signal to be updated at each time step is consistent with the stochastic protocol. The stochastic signal to be updated is randomly selected using a priority encoder 82 coupled to the u 83.

Since only a single stochastic signal is updated at each time step, the summation is much simpler because it is only necessary to add the new stochastic signal value 84 to the previous sum 86 and subtract the previous stochastic signal value 88 for the selected stochastic signal. The last summed value 86 is stored in register 87 and then the previous value of the stochastic signal to be updated is subtracted from the previous sum 86 and the new value 84 added, greatly simplifying the computational requirements.

As shown in FIG. 2B only a single RNG module 80 is needed, and at each time step the RNG 80 generates two random values: a new g with variance σ 84 and a uniformly random u 83 between 1 and $2^{N_S}-1$. The u 83 is sent to a priority encoder 82 that determines which of the stochastic signals 92 to update with the new g with variance σ 84.

To determine which of the stochastic signals 92 to update with the new g with variance σ 84, the priority encoder 82 receives the u 83 from the random number generator and generates a random integer N between 1 and $N_S$ with a $½^N$ probability distribution. The priority encoder 82 does this by effectively evaluating $\lfloor \log_2(u)+1 \rfloor$. The resulting integer which is between 1 and $N_S$ indicates the selected stochastic signal 92 to update. The priority encoder 82 sends control signals 94 to multiplexers 95 and 96 to select the stochastic signal 92 to update.

The summer 90 adds the previous output 89 of the summer 90, which may be stored in register 87, to the new g with variance σ 84, and the priority encoder 82 controls the multiplexers 95 and 96 to route the previous value 92 for the selected stochastic signal to the summer 90, which subtracts this selected previous value 92. As shown in FIG. 2B, the previous stochastic signal value 92 for the selected stochastic signal is stored in a respective register 97 for that respective selected stochastic signal 92. Then the register 97 for that respective stochastic signal is updated to store the new g with variance σ 84. Note that there are $N_S$ registers 97, one for each of the stochastic signal values.

The digital pink noise generation may be implemented using digital logic in a field programmable gate array (FPGA) or be performed with a computer or processor.

Figure 3:
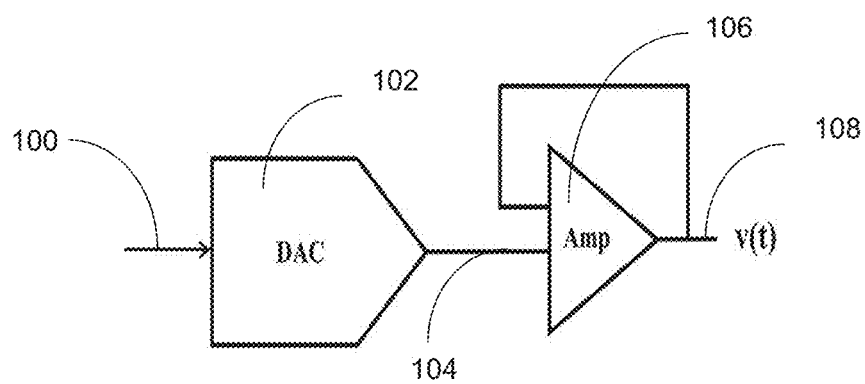
FIG. 3 shows a voltage noise generation circuit with additional circuitry for a digital to analog converter (DAC) and an amplifier in accordance with the present disclosure.

FIG. 3 shows a pink noise voltage generation circuit. The input 100 of digital noise generator circuit may be the output 70 or 86 of FIG. 2A or 2B, respectively. The input 100 may be converted to analog by the digital to analog converter (DAC) 102, and then the analog output 104 of the DAC 102 may be amplified by amplifier 106. The output voltage signal 108 may be used to provide an analog pink noise voltage to another circuit and may be monitored with a standard oscilloscope.

Figure 4B:
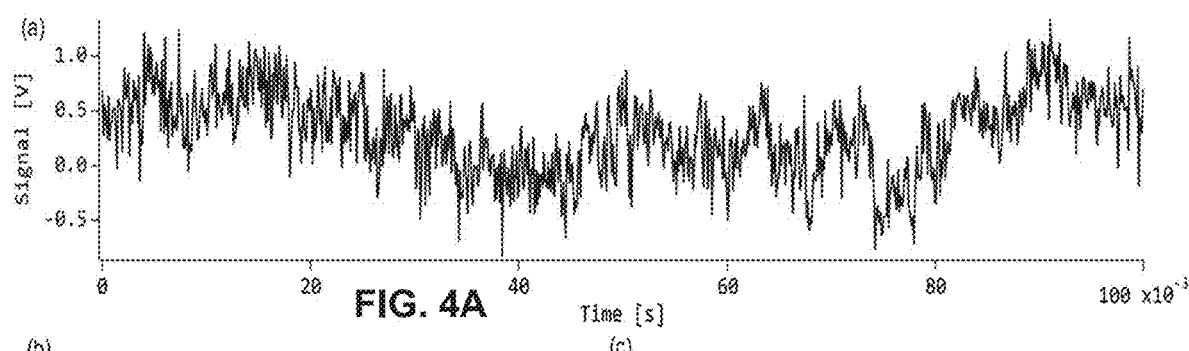
FIG. 4B shows the average measured power spectral density compared to a target spectral density for two different amplitudes.
Figure 4B:
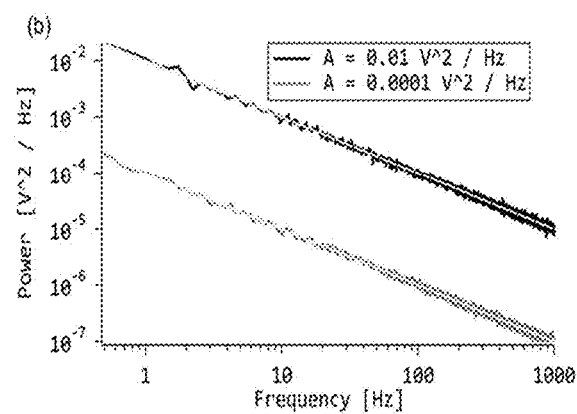
Figure 4C:
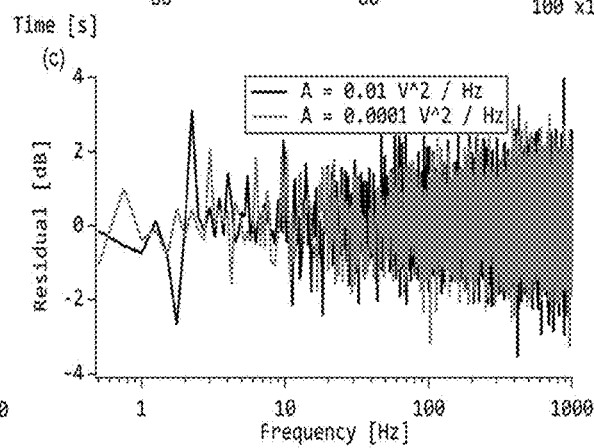
FIG. 4C shows the residual error in FIG. 4B of the measured versus target spectral densities in accordance with the present disclosure.

FIG. 4A shows an example output from the pink noise circuit of FIG. 3, using a sampling frequency of $F_S$=385 kS/s, and shows a single noise trace with A=0.01 V²/Hz. FIG. 4B shows the average measured power spectral density (PSD) compared to a target spectral density for two different amplitudes, which may be set by amplifier 106 in FIG. 3. FIG. 4C shows the residual error in FIG. 4B of the measured PSD versus a target power spectral density. The data shown in FIGS. 4A, 4B and 4C show that the power spectral density is very accurate and the time domain data is smoothly varying with no discrete jumps or artifacts. The data also demonstrate pink (1/f) voltage noise with no low frequency cutoff.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for providing pink noise and for improving computational efficiency for providing pink noise comprising:
   providing $N_S$ stochastic signal generators, wherein each of the $N_S$ stochastic signal generators has a respective output at each discrete time n;
   generating a respective first random number g with variance σ for each respective stochastic signal generator at each discrete time n;
   generating a respective second random number u for each respective stochastic signal generator at each discrete time n;
   comparing for each respective stochastic signal generator the respective second random number u with an update probability for the respective stochastic signal generator at each discrete time n, wherein the update probability for an Nth respective stochastic signal generator is $\frac{1}{2}^N$, where N ranges from 1 to $N_S$ for the respective stochastic signal generators;
   if the respective second random number u is greater than the update probability for the respective stochastic signal generator, then not updating a respective output of the respective stochastic signal generator;
   if the respective second random number u is less than or equal to the update probability for the respective stochastic signal generator, then updating the respective output of the respective stochastic signal generator to be equal to the first random number; and
   summing at each discrete time n the respective output of each of the $N_S$ stochastic signal generators to provide a sum.

2. The method of claim 1 wherein:
   the respective output at each discrete time n for each respective stochastic signal generator is a discrete time series $$B_n(\sigma, p) = \begin{cases} g(\sigma) & \text{with probability} \quad p \\ B_{n-1} & \text{with probability} \quad 1-p \end{cases}$$

where $B_n$ is the current stochastic signal in the discrete time series,
   where $B_{n-1}$ is the previous stochastic signal in the discrete time series,
   where g is a random number with variance σ, and
   where p is the probability that $B_n$ will be set to the new value g.

3. The method of claim 1 wherein:
   each stochastic signal has a power spectral density of $$PSD_k(\sigma, p) = \frac{4\sigma^2/f_0}{1 + \left(\frac{f_k}{f_0}\right)^{2O(p)}},$$

where $f_0 = pF_s$ is a corner frequency,
   where $F_s$ is a sampling frequency, and
   where $f_k$ is a discrete frequency component.

4. The method of claim 1:
   wherein the sum comprises substantially 1/f pink noise over a frequency range.

5. The method of claim 4:
   wherein the frequency range has no low frequency cutoff.

6. The method of claim 1 wherein the method comprises:
   performing the method on a computer or processor; or
   implementing the method with a special purpose processor, digital hardware, or integrated circuit.

7. A device for generating pink noise and for improving computational efficiency for providing pink noise comprising:
   $N_S$ stochastic signal generators, wherein each respective stochastic signal generator of the $N_S$ stochastic signal generators comprises;
      a random number generator for a generating a respective first random number g with variance σ for the respective stochastic signal generator and for generating a respective second random number u for the respective stochastic signal generator;
      a comparator coupled to the random number generator for comparing for the respective stochastic signal generator the respective second random number u with an update probability for the respective stochastic signal generator, wherein the update probability for an Nth respective stochastic signal generator is $\frac{1}{2}^N$, where N ranges from 1 to $N_S$ for the respective stochastic signal generators; and
      a register for storing a respective output of the respective stochastic signal generator, wherein if the respective second random number u is greater than the update probability for the respective stochastic signal generator, then not updating or changing the respective output stored in the register for the respective stochastic signal generator, and wherein if the respective second random number u is less than or equal to the update probability for the respective stochastic signal generator, then storing the first random number in the register; and
   a summer coupled to an output of each respective stochastic signal generator for summing at each discrete time n the respective output of each of the $N_S$ stochastic signal generators.

8. The device of claim 7 wherein:
   the respective output at each discrete time n for each respective stochastic signal generator is a discrete time series $$B_n(\sigma, p) = \begin{cases} g(\sigma) & \text{with probability} \quad p \\ B_{n-1} & \text{with probability} \quad 1-p \end{cases}$$

where $B_n$ is the current stochastic signal in the discrete time series, where $B_{n-1}$ is the previous stochastic signal in the discrete time series, where g is a random number with variance σ, and where p is the probability that $B_n$ will be set to the new value g.

9. The device of claim 7 wherein:

each stochastic signal has a power spectral density of $$PSD_k(\sigma, p) = \frac{4\sigma^2/f_0}{1+\left(\frac{f_k}{f_0}\right)^{2O(p)}},$$

where $f_0 = \rho F_s$ is a corner frequency, where $F_s$ is sampling frequency, and where $f_k$ is a discrete frequency component.

10. The device of claim 7:

wherein an output of the summer comprises substantially 1/f pink noise over a frequency range.

11. The device of claim 7:

wherein an output of the summer has no low frequency cutoff.

12. The device of claim 7 wherein each respective stochastic signal generator of the $N_S$ stochastic signal generators further comprises:

a multiplexer having a first input coupled to the random number generator, a second input coupled to the respective output of the respective stochastic signal generator, a multiplexer output coupled to the register of the respective stochastic signal generator, and a control input coupled to the comparator of the respective stochastic signal generator, wherein the control input controls the multiplexer output to be either the first input or the second input.

13. The device of claim 7 further comprising:

a digital to analog converter coupled to an output of the summer; and an amplifier having a voltage output coupled to the digital to analog converter.

14. A device for generating pink noise and for improving computational efficiency for providing pink noise comprising:

a random number generator for generating a first random number g with variance σ output at each discrete time n, and for generating a second uniformly random number u output at each discrete time n;

$N_S$ registers, each of the $N_S$ registers for storing a respective one of $N_S$ stochastic values;

a priority encoder coupled to the second random number u output for determining at each discrete time n a selected respective stochastic value of the $N_S$ stochastic values to update with the first random number g with variance σ output;

a sum register; and a summer coupled to the $N_S$ registers, the first random number g with variance σ output, and to the sum register, and having an output coupled to the sum register;

wherein the summer adds the first random number g with variance σ to a sum stored in the sum register and subtracts the selected respective stochastic value to form a new sum at each discrete time n;

wherein the new sum is stored in the sum register at each discrete time n; and wherein the first random number g with variance σ output is stored in the respective register for the selected respective stochastic value at each discrete time n.

15. The device of claim 14 further comprising:

a 1 to N multiplexer having an input coupled to the first random number g with variance σ output and $N_S$ outputs, wherein each respective one of the $N_S$ outputs is coupled to a respective one of the $N_S$ registers; and an N to 1 multiplexer having $N_S$ inputs which each respective one of the $N_S$ inputs is coupled to a respective output of one of the $N_S$ registers, wherein the N to 1 multiplexer has an output;

wherein the priority encoder controls the 1 to N multiplexer to couple the first random number g with variance σ output to the respective register for the selected respective stochastic value at each discrete time n, and wherein the priority encoder controls the N to 1 multiplexer to couple the selected respective stochastic value to the summer at each discrete time n.

16. The device of claim 14:

wherein an output of the summer is substantially 1/f pink noise over a frequency range.

17. The device of claim 14:

wherein the frequency range has no low frequency cutoff.

18. The device of claim 14 further comprising:

a digital to analog converter coupled to an output of the summer; and an amplifier having a voltage output coupled to the digital to analog converter.

19. The device of claim 14 wherein:

the priority encoder generates a random integer between 1 and $N_S$ with a $\frac{1}{2^N}$ probability distribution.

20. A method for generating pink noise and for improving computational efficiency for providing pink noise comprising:

generating a first random number g with variance σ output at each discrete time n;

generating a second uniformly random number u output at each discrete time n;

storing $N_S$ stochastic values;

using the second random number u output for determining at each discrete time n a selected respective one of the stored $N_S$ stochastic values to update with the first random number g with variance σ output at each discrete time n;

storing a sum;

adding the first random number g with variance σ output to the sum and subtracting the stochastic value of the selected respective one of the stored $N_S$ stochastic values to form a new sum at each discrete time n;

replacing the stored sum with the new sum at each discrete time n; and replacing the stochastic value of the selected respective one of the stored $N_S$ stochastic values with the first random number g with variance σ output at each discrete time n.

21. The method of claim 20:

wherein the sum comprises substantially 1/f pink noise over a frequency range.

22. The method of claim 21:

wherein the frequency range has no low frequency cutoff.

23. The method of claim 20 wherein using the second random number u output for determining at each discrete time n a selected respective one of the stored $N_S$ stochastic values to update with the first random number g with variance σ output at each discrete time n comprises:

generating a random integer between 1 and $N_S$ with a $\frac{1}{2}^N$ probability distribution.

* * * * *